US009657392B2

(12) United States Patent
Han

(10) Patent No.: US 9,657,392 B2
(45) Date of Patent: May 23, 2017

(54) MASK ASSEMBLY FOR THIN FILM VAPOR DEPOSITION AND MANUFACTURING METHOD THEREOF

(71) Applicant: Samsung Display Co. Ltd., Yongin, Gyeonggi-Do (KR)

(72) Inventor: Jeong-Won Han, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 10 days.

(21) Appl. No.: 14/096,816

(22) Filed: Dec. 4, 2013

(65) Prior Publication Data

US 2014/0158044 A1  Jun. 12, 2014

(30) Foreign Application Priority Data

Dec. 10, 2012  (KR) .................. 10-2012-0142767

(51) Int. Cl.
*C23C 16/04* (2006.01)
*B05C 21/00* (2006.01)
*C23C 14/04* (2006.01)

(52) U.S. Cl.
CPC .......... *C23C 16/042* (2013.01); *B05C 21/005* (2013.01); *C23C 14/042* (2013.01); *Y10T 29/49826* (2015.01)

(58) Field of Classification Search
None
See application file for complete search history.

(56) References Cited

U.S. PATENT DOCUMENTS

| 5,534,969 A * | 7/1996 | Miyake .................. G03F 7/707 250/559.3 |
|---|---|---|
| 6,858,086 B2 | 2/2005 | Kang |
| 2003/0221613 A1 | 12/2003 | Kang et al. |
| 2003/0221614 A1 | 12/2003 | Kang et al. |
| 2004/0104197 A1 | 6/2004 | Shigemura et al. |
| 2004/0163592 A1* | 8/2004 | Abiko .................. C23C 14/042 118/715 |
| 2006/0012290 A1 | 1/2006 | Kang |
| 2011/0265714 A1 | 11/2011 | Lee et al. |
| 2014/0130735 A1* | 5/2014 | Kim .................... H01L 51/0011 118/504 |

FOREIGN PATENT DOCUMENTS

| JP | 2004-006257 | 1/2004 |
|---|---|---|
| KR | 1020070063307 A | 6/2007 |
| KR | 1020090110979 A | 10/2009 |

\* cited by examiner

*Primary Examiner* — Dah-Wei D Yuan
*Assistant Examiner* — Jethro M Pence
(74) *Attorney, Agent, or Firm* — Robert E. Bushnell, Esq.

(57) ABSTRACT

A mask assembly includes a frame for forming an opening, and a mask fixed to the frame while a tensile force is applied thereto and forming a plurality of pattern openings. The frame includes a frame main body for forming an opening, and a plurality of moving members installed to be movable in at least one direction on the frame main body. The mask is fixed to the moving members while a tensile force is applied thereto.

19 Claims, 12 Drawing Sheets

MASK ASSEMBLY FOR THIN FILM VAPOR DEPOSITION AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on Dec. 10, 2012 and duly assigned Serial No. 10-2012-0142767.

BACKGROUND OF THE INVENTION

Field of the Invention

Embodiments of the present invention generally relate to a mask assembly, and more particularly, to a mask assembly used for a thin-film deposition process of an organic emission layer or a metal layer, and a manufacturing method thereof.

Description of the Related Art

Flat panel displays, liquid crystal displays (LCD) and organic light emitting diode (OLED) displays are known displays. A flat panel display includes a metal layer of a predetermined pattern, and in a case of an organic light emitting diode (OLED) display, an organic emission layer of a predetermined pattern is formed for every pixel. A deposition method using a mask assembly as a method of forming the metal layer and the organic emission layer may be applied.

The mask assembly includes a mask with a pattern opening in a like shape of a metal layer or of an organic emission layer that is to be deposited, and a frame for supporting the mask. As the mask is enlarged, an etching error for forming the pattern opening can be increased and the center of the mask can droop by self-gravitation, so the mask is fixed to the frame through welding while a tensile force is applied to the mask.

However, it is then impossible to control the tensile force of the mask fixed to the frame. Adversely, much time and effort are required to extend the mask and weld the mask to the frame, and moreover, a mask having a problem during the extending and welding is discarded. Further, a mask used for the deposition process may generate a problem of reducing uniformity of the pattern opening and accuracy of the pixel position. If a mask has such a problem, it is separated from the frame and is then discarded.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a mask frame for controlling a tensile force of a mask when the mask is fixed to the frame and reducing a number of discarded masks, and a manufacturing method thereof.

An embodiment of the present invention provides a mask assembly including a frame including a frame main body for forming an opening, and a plurality of moving members that are installed in the frame main body to be movable in at least one direction, and a mask for forming a plurality of pattern openings and being fixed to the moving members while a tensile force is applied thereto.

The mask is extended in a first direction and a second direction crossing the first direction, and is fixed to the moving members.

The frame main body includes a pair of first straight lines that are parallel to the first direction, and a pair of second straight lines that are parallel to the second direction.

The moving members are provided for the pair of first straight lines and the pair of second straight lines, and moving directions and displacements thereof are independently controlled.

The moving members include a plurality of first moving members installed in the pair of first straight lines and sliding in the second direction, and a plurality of second moving members installed in the pair of second straight lines and sliding in the first direction.

The moving members include a plurality of third moving members installed at a corner of the frame main body and sliding in a third direction.

The moving members respectively include: a mask fixing unit including a mask fixing side; and a moving controller fixed to the frame main body, combined to the mask fixing unit, and controlling movement of the mask fixing unit.

The moving controller includes a controller main body including a moving guide; a female thread fixed to a rear of the mask fixing unit headed to the frame main body, and a control screw installed in the controller main body and combined to the female thread.

The mask fixing unit forms a receiver for receiving the controller main body and a guide groove corresponding to the moving guide.

The control screw of the first moving member is parallel to the second direction, and the control screw of the second moving member is parallel to the first direction.

The first direction and the second direction are width directions of the mask.

The control screw of the third moving member is parallel to the third direction.

The third direction is a diagonal direction of the mask.

The plurality of moving members respectively include a mask fixing unit including a mask fixing side, and a first moving controller and a second moving controller installed between the frame main body and the mask fixing unit, and moving the mask fixing unit in the first direction and the second direction.

The first moving controller is fixed to the frame main body, the second moving controller is provided between the first moving controller and the mask fixing unit, and a support is provided between the first moving controller and the second moving controller.

The first moving controller includes a first controller main body including a first moving guide, a first female thread fixed to a rear of the support, and a first control screw installed in the first controller main body and combined with the first female thread.

The second moving controller includes a second controller main body including a second moving guide, a second female thread fixed to a rear of the mask fixing unit, and a second control screw installed in the second controller main body and combined to the second female thread.

The first control screw is parallel to the second direction, and the second control screw is parallel to the first direction.

The first direction and the second direction are width directions of the mask.

The support forms a first receiver for receiving the first controller main body, and a first guide groove corresponding to the first moving guide.

The mask fixing unit forms a second receiver for receiving the second controller main body, and a second guide groove corresponding to the second moving guide.

Another embodiment provides a method for manufacturing a mask assembly, including providing a frame including a frame main body and a plurality of moving members that are installed to be movable in at least one direction on the frame main body, fixing a mask to the moving members while a tensile force is applied to the mask, and controlling the tensile force of the mask by sliding at least one of the moving members.

The frame main body includes four straight lines, the moving members are provided for the four straight lines, and moving directions and displacements thereof are independently controlled.

A compression force caused by the tensile force of the mask is applied to the moving members, and the moving members slide in one direction in which the compression force is applied to control the tensile force of the mask.

The moving members slide in a direction that crosses the direction in which the compression force is applied to change a position of a pattern opening formed in the mask.

The mask assembly controls the tensile force of a mask that has generated a problem during the welding process and a mask of which uniformity of the pattern opening and accuracy of the pixel position are reduced, thereby repairing the same and acquiring a good quality product. Therefore, the number of discarded masks is reduced to reduce the production cost, and the time for replacing the mask is reduced to increase the time for consecutively operating the depositor, thereby increasing productivity.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless explicitly described to the contrary, the word "comprise" and variations such as "comprises" or "comprising" will be understood to imply the inclusion of stated elements but not the exclusion of any other elements. In the specification, unless explicitly described to the contrary, the word "comprise" and variations such as "comprises" or "comprising" will be understood to imply the inclusion of stated elements but not the exclusion of any other elements. Further, in the specification, an upper part of a target portion indicates an upper part or a lower part of a target portion, and it does not mean that the target portion is always positioned at the upper side based on a gravity direction.

Figure 1:
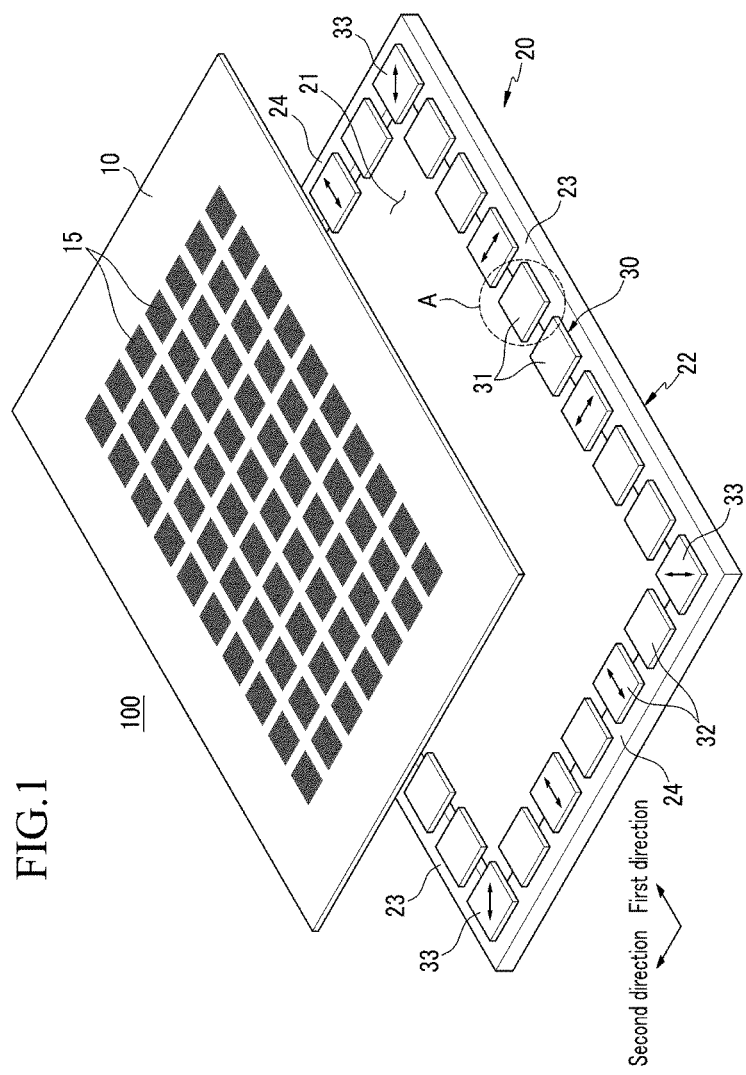
FIG. 1 shows an exploded oblique view of a mask assembly constructed as a first embodiment according to the principles of the present invention.
Figure 2:
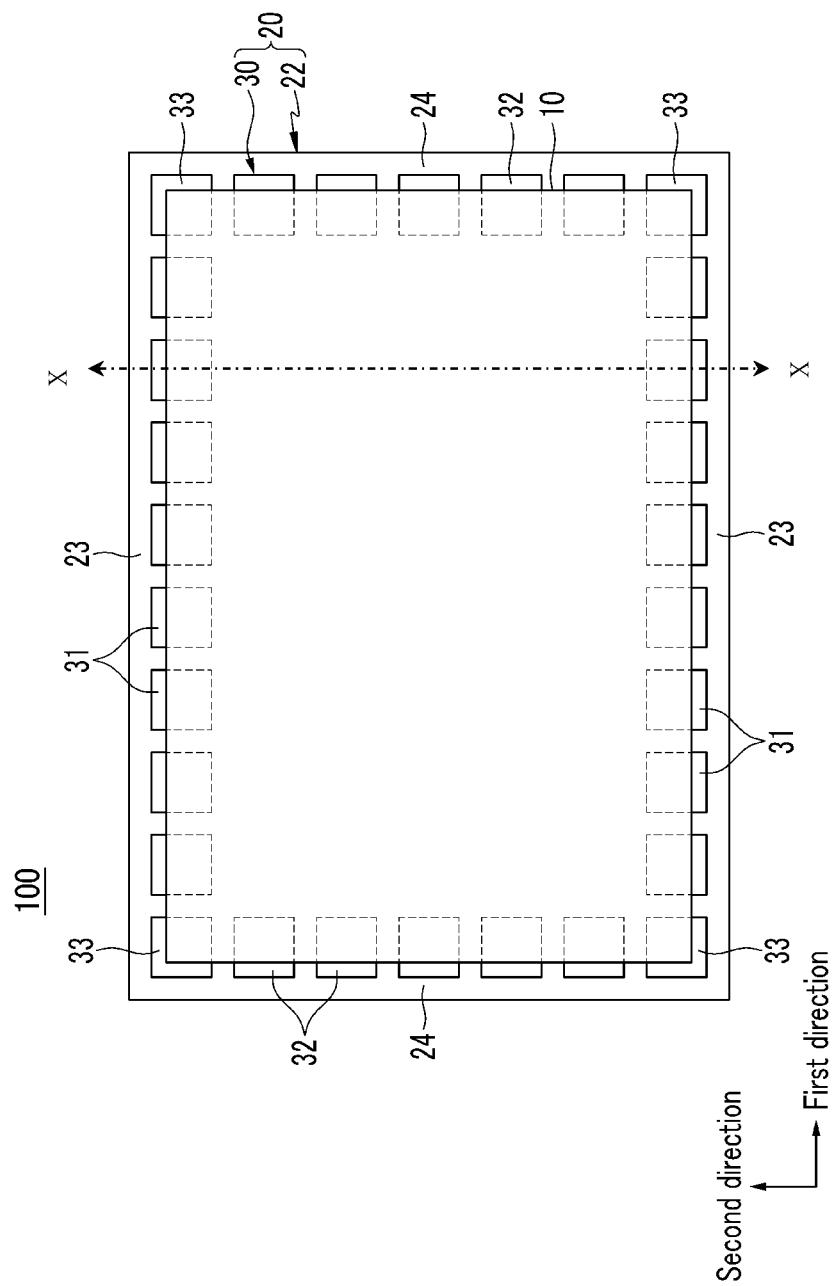
FIG. 2 shows a top plan view of a mask assembly constructed as a first embodiment according to the principles of the present invention.

FIG. 1 and FIG. 2 respectively show an exploded oblique view and a top plan view of a combined state of a mask assembly constructed as a first embodiment according to the principles of the present invention.

Referring to FIG. 1 and FIG. 2, a mask assembly 100 includes a mask 10 for forming a plurality of pattern openings 15, and a frame 20 for forming an opening 21 for exposing the plurality of pattern openings 15 and supporting the mask 10. The frame 20 includes a frame main body 22 and a plurality of moving members 30 that are installed in the frame main body 22, and the mask 10 is fixed to the moving members 30 through welding.

The mask 10 is formed as a quadrangular thin metal plate, and forms the plurality of pattern openings 15. The pattern openings 15 are configured with a plurality of fine openings such that a thin film may be deposited therethrough. Therefore, during the deposition process, a deposition material passes through the pattern openings 15 and is deposited on a substrate (not shown) to form a thin film (e.g., a metal layer or an organic emission layer) in a desired shape.

One pattern opening 15 corresponds to one flat display device (e.g., an organic light emitting diode (OLED) display). In this case, the patterns corresponding to a plurality of flat panel displays can be simultaneously deposited through a single process using one mask assembly 100. That is, the mask assembly 100 corresponds to one mother substrate, and the patterns corresponding to the flat display devices can be simultaneously formed on the mother substrate.

The mask 10 is extended in two width directions. In FIG. 1 and FIG. 2, a horizontal width direction of the mask is shown to be a first direction, and a width direction perpendicular to the horizontal direction is shown to be a second direction. The first direction crosses the second direction. A clamp device (not shown) can be installed at each of four edges of the mask 10 so as to extend the mask 10.

The frame 20 includes the quadrangular frame main body 22 having the opening 21 in the center thereof, and the plurality of moving members 30 that are installed on one side of the frame main body 22 toward the mask 10. The mask 10 is fixed to the moving members 30 rather than the frame main body 22 through welding.

The frame main body 22 includes a pair of first straight lines 23 that are parallel to the first direction and a pair of second straight lines 24 that are parallel to the second direction. The first straight lines 23 may be longer than the second straight lines 24 depending on the shape of the mask 10. A plurality of pattern openings 15 that are formed in the mask 10 are provided corresponding to the opening 21 of the frame main body 22.

The mask 10 to which the tensile force is applied is fixed to the moving members 30 so a compression force is applied in an extension direction (the first direction and the second direction) of the mask 10 to the frame main body 22. Therefore, the frame main body 22 can be manufactured with a metal material with great rigidity such as stainless steel so that it may not be deformed by the compression force.

The plurality of moving member 30 are installed for a pair of the first straight lines 23 and a pair of the second straight lines 24, respectively, and they are installed to be movable on the frame main body 22 in one direction.

In detail, the moving members 30 include a plurality of first moving members 31 installed on a pair of the first straight lines 23 and a plurality of second moving members 32 installed on a pair of the second straight lines 24. The compression force is applied to the plurality of first moving members 31 in the second direction according to the tensile force of the mask 10, and the compression force is applied to the plurality of second moving members 32 in the first direction according to the tensile force of the mask 10.

The first moving members 31 are installed to be movable on the frame main body 22 in the second direction in which the compression force is applied to thereby control the tensile force of the mask 10 according to the second direction. The second moving members 32 are installed to be movable on the frame main body 22 in the first direction in which the compression force is applied to thereby control the tensile force of the mask 10 according to the first direction.

In this instance, moving directions and displacements of the plurality of the first moving members 31 and the plurality of the second moving members 32 are independently controlled by a moving controller to be described. Therefore, the mask assembly 100 can apply different deformations to various parts of the mask 10 when the mask 10 is fixed to the plurality of moving members 30. That is, the mask is moved with a desired direction and a desired displacement for a specific part of the mask 10 where the tensile force needs be controlled so that the tensile force of the mask 10 can be controlled in a precise manner.

Figure 3:
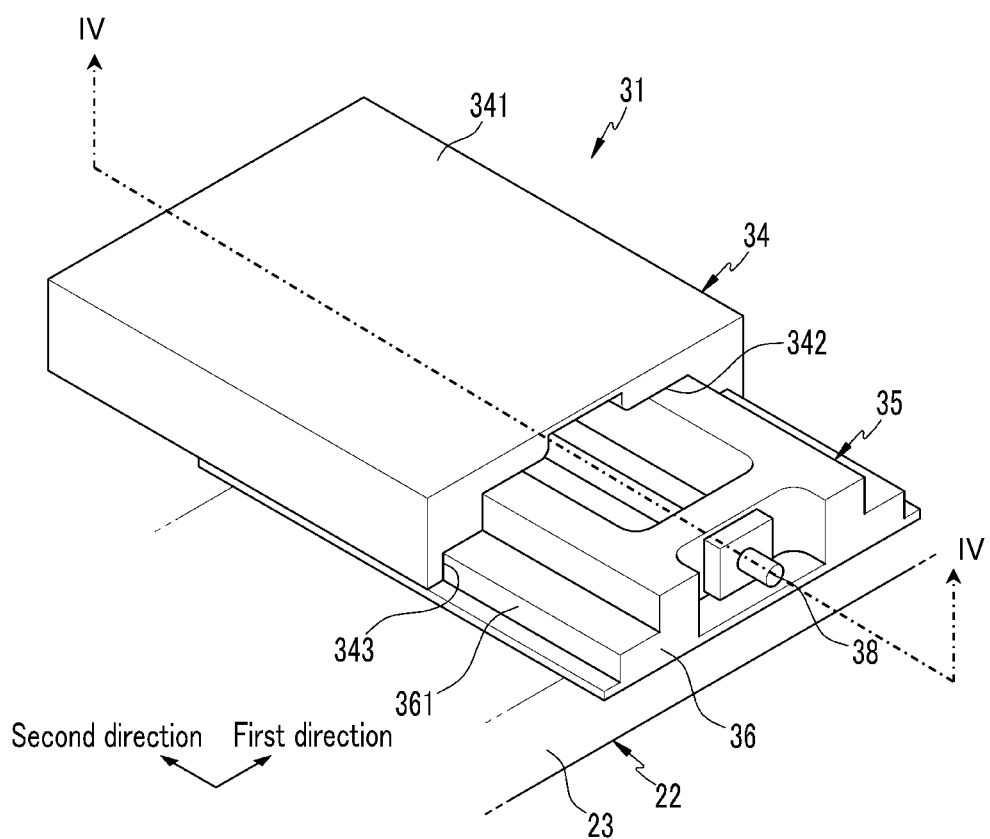
FIG. 3 shows an enlarged view of a part A of FIG. 1.
Figure 4:
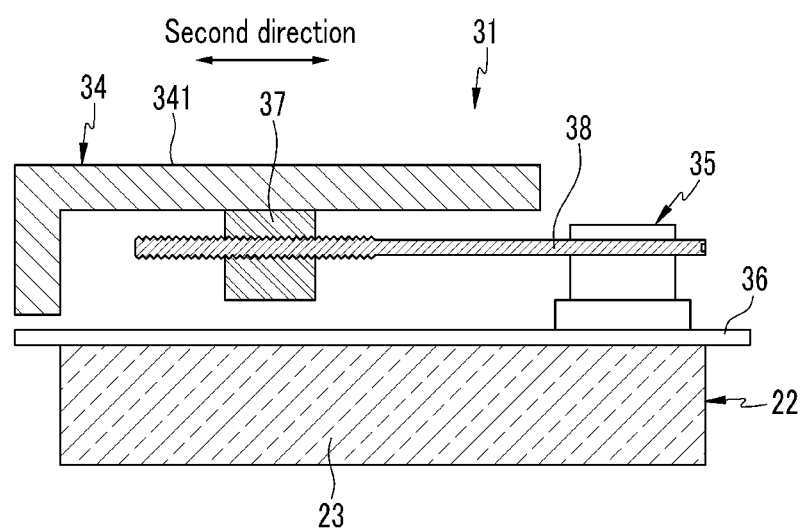
FIG. 4 shows a cross-sectional view of a mask fixing unit and a moving member taken along line VI-VI shown in FIG. 3.

FIG. 3 shows an enlarged view of a part A of FIG. 1, and FIG. 4 shows a cross-sectional view of a mask fixing unit and a moving member taken along line VI-VI shown in FIG. 3.

Referring to FIG. 3 and FIG. 4, the first moving member 31 includes a mask fixing unit 34 including a mask fixing side 341 on which the mask 10 is welded, and a moving controller 35 installed between the frame main body 22 and the mask fixing unit 34 and controlling the moving direction and the displacement of the mask fixing unit 34. The moving controller 35 is fixed to the frame main body 22, and the mask fixing unit 34 slides in the second direction on the moving controller 35. A receiver 342 for receiving the moving controller 35 is formed on the mask fixing unit 34.

The moving controller 35 includes a controller main body 36 including a pair of moving guides 361, a female thread 37 fixed to a rear of the mask fixing unit 34 headed to the frame main body 22, and a control screw 38 installed in the controller main body 36 and to which the female thread 37 is combined.

The pair of moving guides 361 and the control screw 38 are parallel to the second direction, and a guide groove 343 corresponding to the pair of moving guides 361 is formed in the receiver 342 of the mask fixing unit 34. The control screw 38 is manually operated by an operator or it is combined with an external power source (not shown), and its rotation direction and rotation amount are automatically controlled.

When the control screw 38 is rotated in one direction, the female thread 37 combined to the control screw 38 and the mask fixing unit 34 fixed to the female thread 37 slide in the second direction. In this instance, the moving guide 361 and the guide groove 343 guide movement of the mask fixing unit 34. A movement amount of the mask fixing unit 34 is proportional to the rotation amount of the control screw 38. The moving direction and the displacement of the mask fixing unit 34 can be precisely controlled according to the rotation direction and the rotation amount of the control screw 38.

The configuration of the moving controller 35 is not restricted to the described embodiment, and any configurations for moving the mask fixing unit 34 on the frame main body 22 and changing the moving direction and the displacement are applicable.

Referring to FIG. 1 and FIG. 2, the second moving member 32 has an equivalent configuration as the first moving member 31 except that the control screw and a pair of moving guides are disposed in the first direction and the sliding direction is the first direction.

The moving members 30 are provided at a corner of the frame main body 22 and include at least one third moving member 33 sliding in a third direction. The third direction is a diagonal direction of the mask 10, and has a predetermined angle with respect to the first direction and the second direction. The third moving member 33 has an equivalent configuration of the first moving member 31 except that the control screw and a pair of moving guides are disposed in the third direction and the sliding direction is the third direction.

Therefore, the mask assembly 100 controls the tensile force of the mask 10 having generated a problem during the welding process and the mask 10 of which the uniformity of the pattern opening 15 and the accuracy of the pixel position are reduced, and repairs the same. As a result, the number of discarded masks is reduced to lower production costs, and the time for replacing the mask is reduced to increase the time for consecutively operating the depositor and thereby increase productivity.

Figure 5:
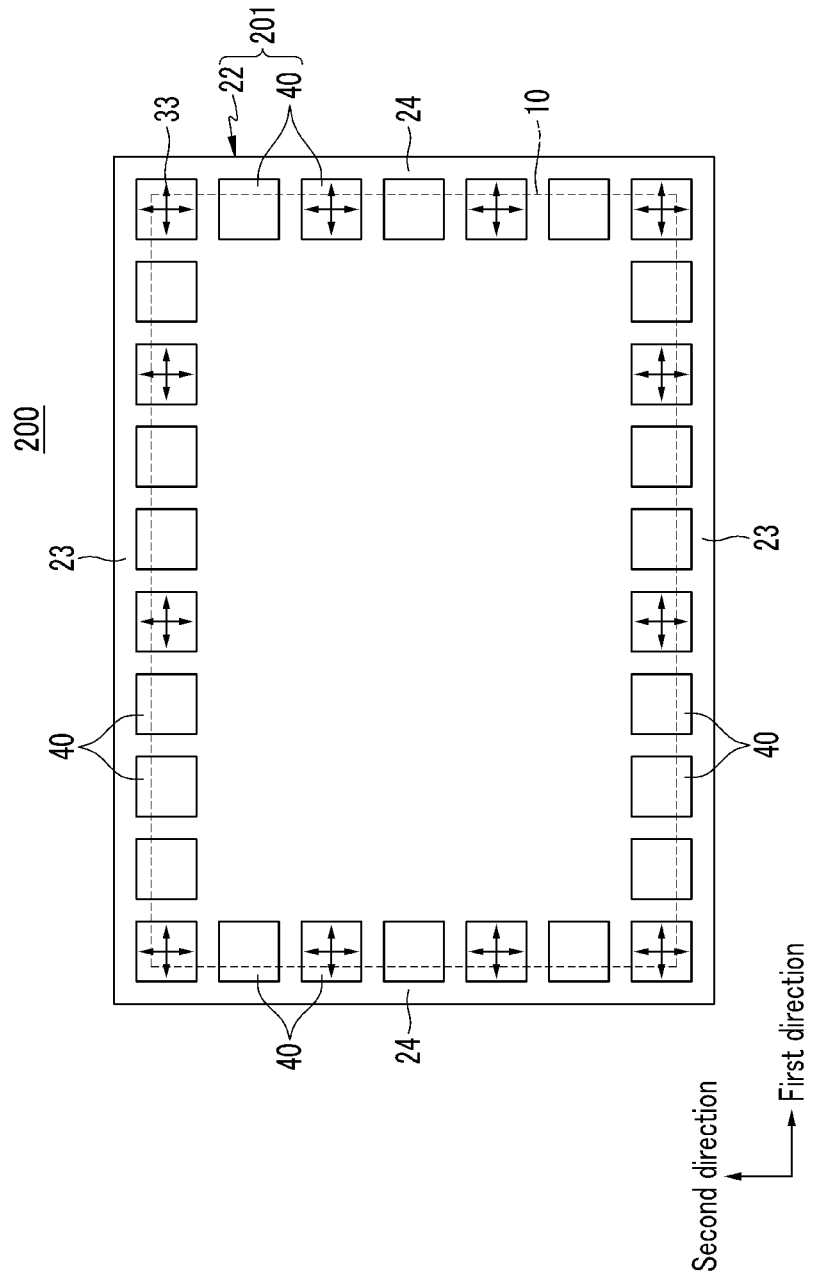
FIG. 5 shows a top plan view of a mask assembly constructed as a second embodiment according to the principles of the present invention.

FIG. 5 shows a top plan view of a mask assembly constructed as a second embodiment according to the working principles of the present invention.

Referring to FIG. 5, the mask assembly 200 according to the second embodiment has a similar configuration to the mask assembly according to the first embodiment except that a plurality of moving members 40 slide in the first direction and the second direction. The same members as in the first embodiment will have the same reference numerals, and differences from the first embodiment will be described hereinafter.

The plurality of moving members in the first embodiment are classified as the first moving member, the second moving member, and the third moving member depending on the sliding direction, and the plurality of moving members 40 in the second embodiment have a moving controller with the same configuration and they slide not in one direction but in two directions (both the first direction and the second direction).

Figure 6:
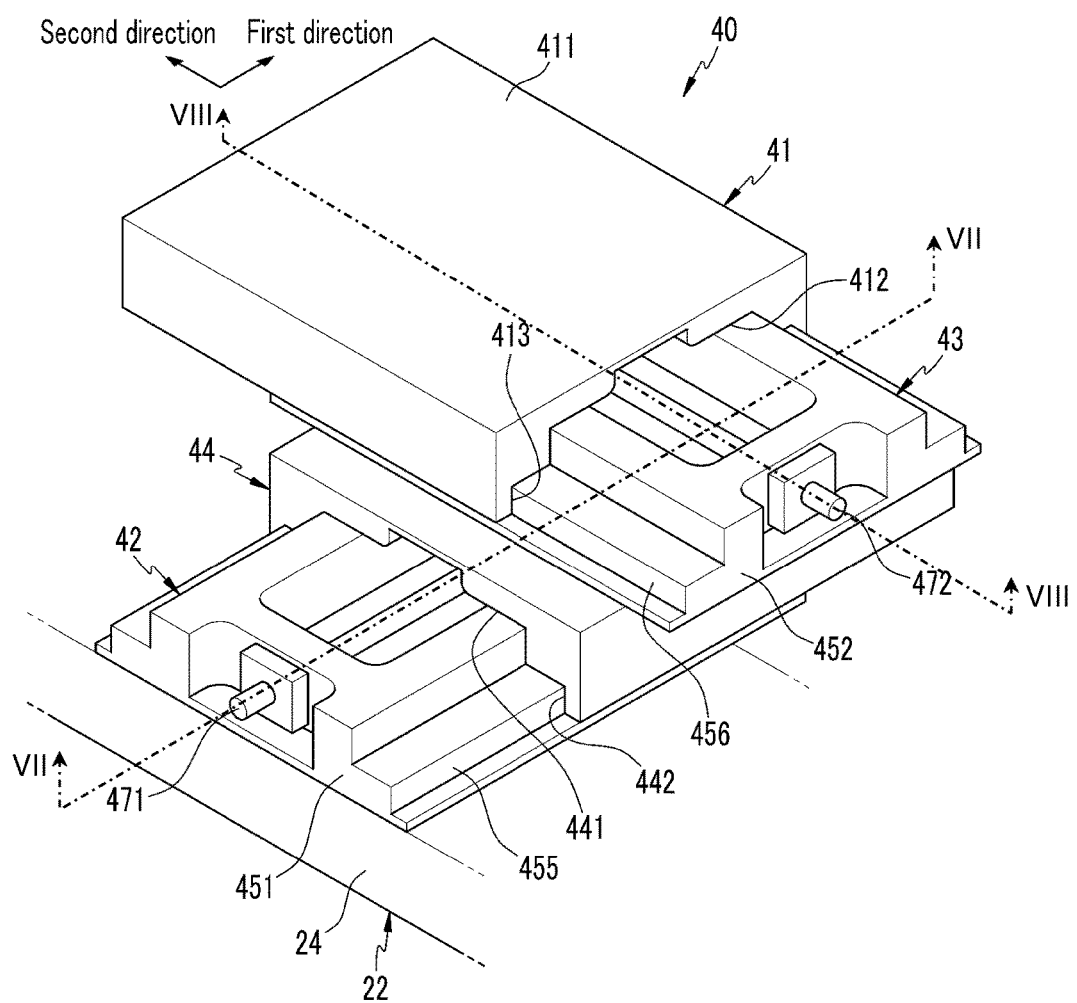
FIG. 6 shows an oblique view of a moving member shown in FIG. 5.
Figure 7:
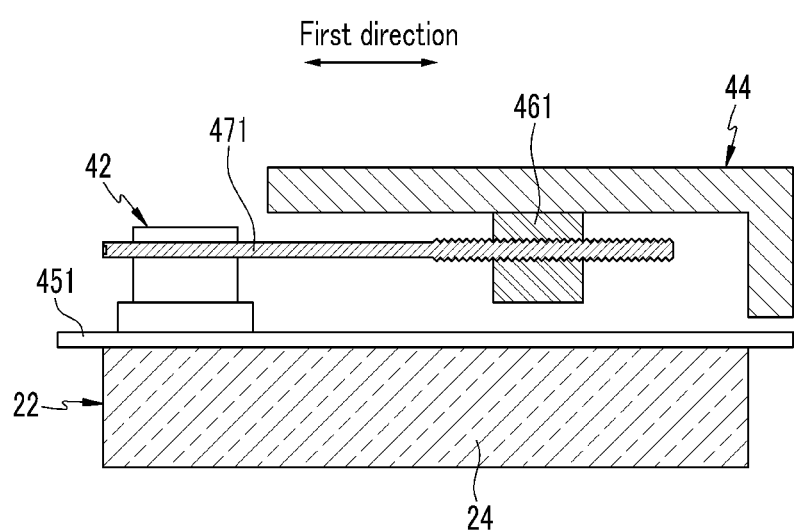
FIG. 7 shows a cross-sectional view of a first moving member and a support shown in FIG. 6.
Figure 8:
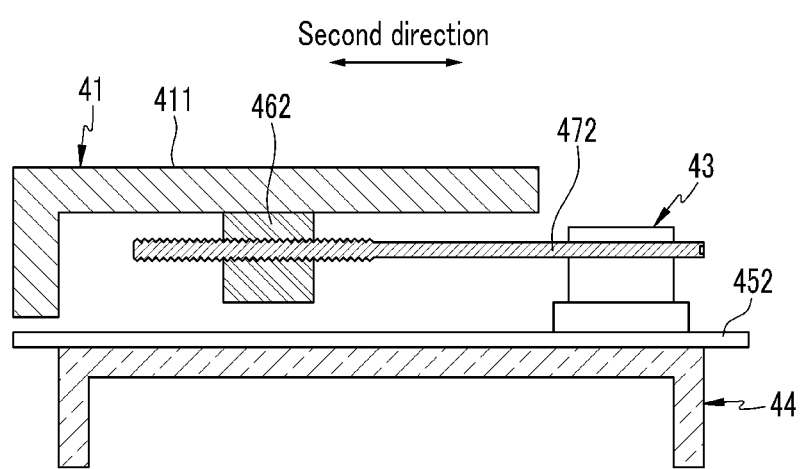
FIG. 8 shows a cross-sectional view of a second moving member and a mask fixing unit shown in FIG. 6.

FIG. 6 shows an oblique view of a moving member shown in FIG. 5, FIG. 7 shows a cross-sectional view of a first moving member and a support shown taken along line VII-VII in FIG. 6, and FIG. 8 shows a cross-sectional view of a second moving member and a mask fixing unit taken along line VIII-VIII shown in FIG. 6. FIG. 6 to FIG. 8 exemplify a moving member 40 installed on the second straight lines 24 of a frame 201.

Referring to FIG. 6 to FIG. 8, the moving member 40 includes a mask fixing unit 41 including a mask fixing side 411 on which the mask 10 is welded, and a first moving controller 42 and a second moving controller 43 provided between the frame main body 22 and the mask fixing unit 41. The first moving controller 42 is provided below the second moving controller 43, and a support 44 for supporting the second moving controller 43 is provided between the first moving controller 42 and the second moving controller 43.

The first moving controller 42 is fixed to the frame main body 22, and the support 44, the second moving controller 43, and the mask fixing unit 41 that are installed thereon slide in the first direction by the first moving controller 42. A first receiver 441 for receiving the first moving controller 42 is formed on the support 44.

The first moving controller 42 includes a first controller main body 451 including a pair of first moving guides 455, a first female thread 461 fixed to a rear of the support 44 headed to the first controller main body 451, and a first control screw 471 installed in the first controller main body 451 and combined to the first female thread 461. The first moving guide 455 and the first control screw 471 are parallel with the first direction, and a first guide groove 442 corresponding to the first moving guide 455 is formed in the first receiver 441.

The second moving controller 43 is fixed to the support 44, and the mask fixing unit 41 slides in the second direction by the second moving controller 43. A second receiver 412 for receiving the second moving controller 43 is formed on the rear of the mask fixing unit 41.

The second moving controller 43 includes a second controller main body 452 including a pair of second moving guides 456, a second female thread 462 fixed to the rear of the mask fixing unit 41 headed to the second controller main body 452, and a second control screw 472 installed in the second controller main body 452 and combined to the second female thread 462. The second moving guide 456 and the second control screw 472 are parallel to the second direction, and a second guide groove 413 corresponding to the second moving guide 456 is formed in the second receiver 412 of the mask fixing unit 41.

When the first control screw 471 rotates in one direction, the first female thread 461 combined to the first control screw 471, the support 44 fixed to the first female thread 461, the second moving controller 43, and the mask fixing unit 41 slide in the first direction. A moving direction and a displacement of the mask fixing unit 41 in the first direction can be precisely controlled according to a rotation direction and a rotation amount of the first control screw 471.

When the second control screw 472 rotates in one direction, the second female thread 462 combined to the second control screw 472 and the mask fixing unit 41 fixed to the second female thread 462 slide in the second direction. A moving direction and a displacement of the mask fixing unit 41 in the second direction can be precisely controlled according to a rotation direction and a rotation amount of the second control screw 472.

Referring to FIG. 5 and FIG. 6, regarding the moving member 40 installed in the first straight lines 23 of the frame 201, the support 44, the second moving controller 43, and the mask fixing unit 41 slide in the second direction by the first moving controller 42, and the mask fixing unit 41 slides in the first direction by the second moving controller 43.

In the mask assembly 200 according to the second embodiment, the mask 10 is fixed to the frame 201 and an edge of the mask 10 can be moved in the extension direction of the mask 10 and its crossing direction. Therefore, the tensile force of the mask 10 can be controlled by moving the mask 10 in a desired direction and with a desired displacement for a specific part of the mask 10 that requires control of the tensile force, and the position of the pattern opening 15 (refer to FIG. 1) can be controlled by moving the mask 10 in a direction that crosses the extension direction.

A method for manufacturing a mask assembly will now be described.

Figure 9:
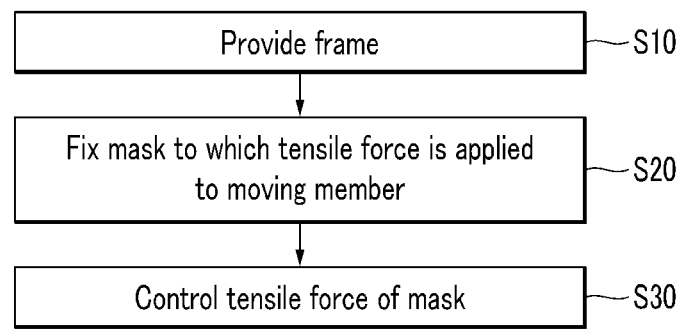
FIG. 9 shows a process flowchart of a method for manufacturing a mask assembly constructed as an embodiment according to the principles of the present invention.

FIG. 9 shows a process flowchart of a method for manufacturing a mask assembly constructed as an embodiment according to the principles of the present invention.

Referring to FIG. 9, the method for manufacturing a mask assembly includes providing a frame configured with a frame main body and a plurality of moving members (S10), fixing a mask to the moving members while applying a tensile force to the mask (S20), and controlling the tensile force of the mask by sliding at least one of the moving members (S30).

In the mask assembly according to the first embodiment, the tensile force of the mask is controlled by sliding the moving members in the mask extension direction. In the mask assembly according to the second embodiment, the tensile force of the mask is controlled and the position of the pattern opening is controlled by sliding the moving members in the mask extension direction and its crossing direction.

Figure 10:
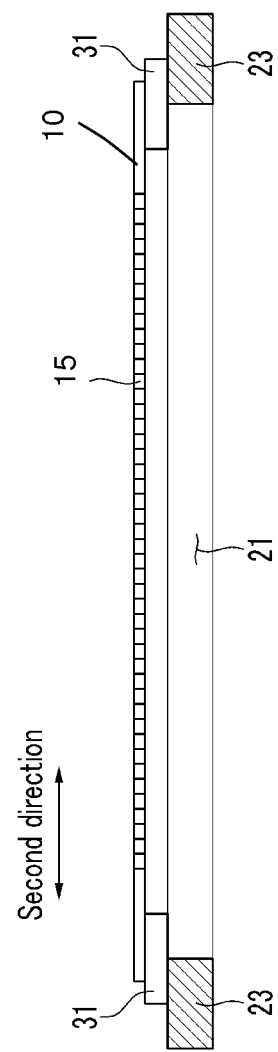
FIG. 10 shows a cross-sectional view of a mask assembly of a second stage shown in FIG. 9.

FIG. 10 shows a cross-sectional view of a mask assembly taken along line X-X of FIG. 2. FIG. 10 illustrates a second stage shown in FIG. 9.

Referring to FIG. 2 and FIG. 10, the mask 10 is fixed to a plurality of moving members 30 through welding while the tensile force is applied in the first direction and the second direction. In this instance, the mask 10 is fixed not to the frame main body 22 but to the moving members 30 so the tensile force is changeable after the mask 100 is fixed to the frame 20. That is, the tensile force of the mask 10 can be controlled after the mask 10 is fixed to the frame 20, and the tensile force can be controlled after it is used for the deposition process many times.

Figure 11:
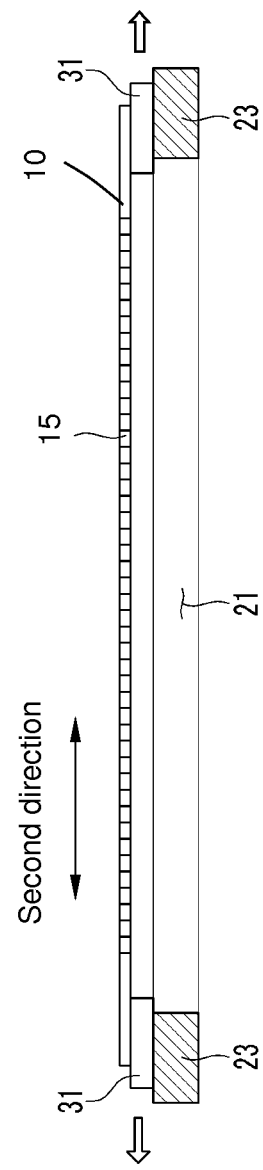
FIG. 11 and FIG. 12 show cross-sectional views of a mask assembly of a third stage shown in FIG. 9.
Figure 12:
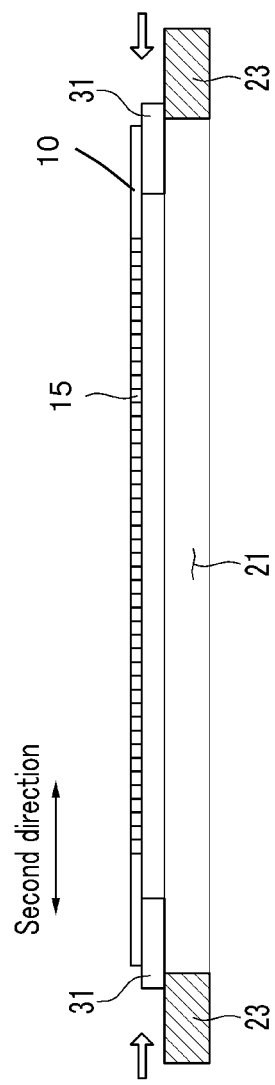

FIG. 11 and FIG. 12 show cross-sectional views of a mask assembly of a third stage shown in FIG. 9. FIG. 11 and FIG. 12 show the mask assembly according to the first embodiment.

Referring to FIG. 11, when the tensile force of the mask 10 needs to be increased, the control screw is manipulated to allow the first moving member 31 to slide to be distant from the center of the opening 21. An end of the mask 10 moves along the first moving member 31 to increase the tensile force in the second direction.

Referring to FIG. 12, when the tensile force of the mask 10 needs to be reduced, the control screw is manipulated to allow the first moving member 31 to slide to the center of the opening 21. The end of the mask 10 moves along the first moving member 31 to reduce the tensile force in the second direction. In both cases that are shown with reference to FIG.

11 and FIG. 12, the tensile force can be appropriately controlled according to the displacement of the first moving member 31.

FIG. 11 and FIG. 12 show the case in which two first moving members 31 provided at both ends of the mask 10 move simultaneously with the same displacement, and in addition to this, one first moving member 31 may be movable, and when the two first moving members 31 move together, the displacements of the two first moving members 31 can be different.

Referring to FIG. 2, in a like manner of the first moving member 31, the tensile force of the mask 10 in the first direction can be increased or reduced by controlling the sliding of the second moving member 32. The tensile force of the mask 10 in the third direction can be increased or reduced by controlling the sliding of the third moving member 33.

Here, the moving directions and the displacements of the respective moving members 30 are independently controlled, so the tensile force of the mask 10 can be precisely controlled according to the position by moving the mask 10 with a desired direction and displacement for a specific part of the mask 10 that requires control of the tensile force.

Referring to FIG. 5, in the mask assembly 200 according to the second embodiment, the moving members 40 respectively slide in the first direction and the second direction. Therefore, the tensile force of the mask 10 can be controlled by sliding the moving member 40 in the extension direction of the mask 10, and a position of the pattern opening 15 can be controlled by sliding the moving member 40 in the direction crossing the extension direction (refer to FIG. 1).

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask assembly comprising:
   a frame comprising a frame main body forming an opening;
   a plurality of moving members installed in the frame main body, each of the moving members movable in at least one direction; and
   a mask disposed on the frame, a surface of the mask, on which a plurality of pattern openings are formed, facing the surface of the frame main body on which the moving members are installed, each of the moving members disposed only between the surface of the mask, on which the plurality of pattern openings are formed, and the surface of the frame main body on which the moving members are installed.

2. The mask assembly of claim 1, wherein
   the mask is extended in a first direction and a second direction crossing the first direction, and
   the at least one direction is parallel to the first direction or the second direction.

3. The mask assembly of claim 2, wherein
   the frame main body comprises a pair of first straight lines that are parallel to the fist direction, and a pair of second straight lines that are parallel to the second direction, and
   the moving members are provided for the pair of first straight lines and the pair of second straight lines, and moving directions and displacements of each moving member are independently controlled.

4. The mask assembly of claim 3, wherein the moving members include:
   a plurality of first moving members installed in the pair of first straight lines and sliding in the second direction; and
   a plurality of second moving members installed in the pair of second straight lines and sliding in the first direction.

5. The mask assembly of claim 4, wherein the moving members comprise a plurality of third moving members installed at a corner of the frame main body and sliding in a third direction.

6. The mask assembly of claim 5, wherein each of the moving members comprises:
   a moving controller fixed to the surface of the frame main body; and
   a mask fixing unit installed on the moving controller, the mask fixing unit including a mask fixing side on which the mask is fixed, a movement of the mask fixing unit being controlled by the moving controller.

7. The mask assembly of claim 6, wherein the moving controller includes:
   a controller main body including a moving guide;
   a female thread fixed to a surface of the mask fixing unit facing the frame main body; and
   a control screw installed in the controller main body and combined to the female thread.

8. The mask assembly of claim 7, wherein the mask fixing unit forms a receiver receiving the controller main body and a guide groove corresponding to the moving guide.

9. The mask assembly of claim 7, wherein
   the control screw of each of the first moving members extending parallel to the second direction,
   the control screw of each of the second moving members extending parallel to the first direction, and
   each of the first direction and the second direction is parallel to the surface of the mask.

10. The mask assembly of claim 7, wherein
    the control screw of each of the third moving members is parallel to the third direction, and
    the third direction is parallel to the surface of the mask, the third direction being an oblique direction from the first direction.

11. The mask assembly of claim 3, wherein each of the plurality of moving members comprises:
    a mask fixing unit including a mask fixing side on which the mask is fixed; and
    a first moving controller and a second moving controller disposed between the frame main body and the mask fixing unit, the first moving controller moving the mask fixing unit in the first direction, the second moving controller moving the mask fixing unit in the second direction.

12. The mask assembly of claim 11, wherein
    the first moving controller is fixed to the frame main body,
    the second moving controller is provided between the first moving controller and the mask fixing unit, and
    a support is provided between the first moving controller and the second moving controller.

13. The mask assembly of claim 12, wherein
    the first moving controller includes a first controller main body including a first moving guide, a first female thread fixed to a surface of the support, facing the frame main body and a first control screw installed in the first controller main body and combined with the first female thread, and
    the second moving controller includes a second controller main body including a second moving guide, a second female thread fixed to a rear of the mask fixing unit, facing the frame main body, and a second control screw installed in the second controller main body and combined to the second female thread.

14. The mask assembly of claim 13, wherein
the first control screw extending parallel to the first direction,
the second control screw extending parallel to the second direction, and
each of the first direction and the second direction is parallel to the surface of the mask.

15. The mask assembly of claim 13, wherein
the support forms a first receiver for receiving the first controller main body, and a first guide groove corresponding to the first moving guide, and
the mask fixing unit forms a second receiver for receiving the second controller main body, and a second guide groove corresponding to the second moving guide.

16. A method for manufacturing a mask assembly, the method comprising:
providing a frame comprising a frame main body forming an opening and a plurality of moving members installed on a surface of the frame main body, each of the moving members movable in at least one direction;
fixing a mask to the moving members while a tensile force is applied to the mask; the mask dispose on the frame, a surface of the mask, on which a plurality of pattern openings are formed, facing the surface of the frame main body on which the moving members are installed, each of the moving members disposed only between the surface of the mask, on which the plurality of pattern openings are formed, and the surface of the frame main body on which the moving members are installed; and
controlling the tensile force of the mask by sliding at least one of the moving members.

17. The method of claim 16, wherein
the frame main body includes four straight lines, and
the moving members are disposed on the four straight lines, and moving directions and displacements of each moving member are independently controlled.

18. The method of claim 17, wherein if a compression force caused by the tensile force of the mask is applied to the moving members, the moving members slide in a direction in which the compression force is applied to control the tensile force of the mask.

19. The method of claim 17, wherein compression force caused by the tensile force of the mask is applied to the moving members, the moving members slide in another direction that crosses the direction in which the compression force is applied to change a position of a pattern opening formed in the mask.

* * * * *